United States Patent
Yin et al.

(10) Patent No.: US 12,200,387 B2
(45) Date of Patent: Jan. 14, 2025

(54) RECEIVING A RESET SIGNAL DURING A REST PERIOD AND A RAMP SIGNAL DURING A SENSING PERIOD THROUGH THE CONTROL TERMINAL OF THE RESET TRANSISTOR IN AN IMAGE SENSOR AND IMAGE SENSING METHOD

(71) Applicant: Guangzhou Tyrafos Semiconductor Technologies Co., LTD, Guangzhou (CN)

(72) Inventors: Ping-Hung Yin, Taipei (TW); Jia-Shyang Wang, Miaoli County (TW); Jai-Jyun Shen, New Taipei (TW)

(73) Assignee: Guangzhou Tyrafos Semiconductor Technologies Co., LTD, Guangzhou (CN)

( * ) Notice: Subject to any disclaimer, the term of this patent is extended or adjusted under 35 U.S.C. 154(b) by 142 days.

(21) Appl. No.: 18/306,988

(22) Filed: Apr. 25, 2023

(65) Prior Publication Data
US 2023/0370747 A1    Nov. 16, 2023

Related U.S. Application Data

(60) Provisional application No. 63/341,423, filed on May 13, 2022.

(51) Int. Cl.
| | |
|---|---|
| *H04N 5/335* | (2011.01) |
| *G06F 1/08* | (2006.01) |
| *H01L 25/075* | (2006.01) |
| *H01L 25/18* | (2023.01) |
| *H01L 27/146* | (2006.01) |

(Continued)

(52) U.S. Cl.
CPC ............... *H04N 25/78* (2023.01); *G06F 1/08* (2013.01); *H01L 25/0753* (2013.01); *H01L 25/18* (2013.01); *H01L 27/14612* (2013.01); *H01L 27/14632* (2013.01); *H01L 27/14636* (2013.01); *H03K 19/018521* (2013.01); *H03L 7/099* (2013.01); *H04N 25/60* (2023.01); *H04N 25/627* (2023.01); *H04N 25/63* (2023.01); *H04N 25/709* (2023.01);
(Continued)

(58) Field of Classification Search
CPC .................................................... H04N 25/772
See application file for complete search history.

(56) References Cited

U.S. PATENT DOCUMENTS

| | | | | |
|---|---|---|---|---|
| 2018/0352183 A1* | 12/2018 | Yin | ......................... | H04N 25/70 |
| 2023/0370743 A1* | 11/2023 | Yin | ......................... | H04N 25/78 |

(Continued)

*Primary Examiner* — Gary C Vieaux
(74) *Attorney, Agent, or Firm* — JCIPRNET

(57) ABSTRACT

Disclosed are an image sensor and an image sensing method. The image sensor includes a first pixel circuit. The first pixel circuit includes a first driving transistor, a first selection transistor, a first transfer transistor, a first reset transistor and a first sensing unit. A control terminal of the first selection transistor is used for receiving a first selection signal. A control terminal of the first transmitting transistor is used for receiving a first transmitting signal. The image sensing method includes the following steps: receiving a first reset signal during a reset period through a control terminal of the first reset transistor; and receiving a first ramp signal during a sensing period through a control terminal of the first reset transistor.

17 Claims, 7 Drawing Sheets

(51) Int. Cl.
*H03K 19/0185* (2006.01)
*H03L 7/099* (2006.01)
*H04N 25/60* (2023.01)
*H04N 25/627* (2023.01)
*H04N 25/63* (2023.01)
*H04N 25/709* (2023.01)
*H04N 25/76* (2023.01)
*H04N 25/77* (2023.01)
*H04N 25/772* (2023.01)
*H04N 25/778* (2023.01)
*H04N 25/78* (2023.01)

(52) U.S. Cl.
CPC ........... *H04N 25/77* (2023.01); *H04N 25/772* (2023.01); *H04N 25/778* (2023.01); *H04N 25/7795* (2023.01)

(56) References Cited

U.S. PATENT DOCUMENTS

2023/0370744 A1* 11/2023 Yin .......................... H03L 7/099
2023/0370750 A1* 11/2023 Yin ................ H03K 19/018521
2023/0370751 A1* 11/2023 Yin ......................... H03L 7/099

* cited by examiner

RECEIVING A RESET SIGNAL DURING A REST PERIOD AND A RAMP SIGNAL DURING A SENSING PERIOD THROUGH THE CONTROL TERMINAL OF THE RESET TRANSISTOR IN AN IMAGE SENSOR AND IMAGE SENSING METHOD

CROSS-REFERENCE TO RELATED APPLICATION

This application claims the priority benefit of U.S. provisional application Ser. No. 63/341,423, filed on May 13, 2022. The entirety of the above-mentioned patent application is hereby incorporated by reference herein and made a part of this specification.

BACKGROUND

Technical Field

This disclosure is related to a sensing circuit, and more specifically, it is related to an image sensor and an image sensing method.

Description of Related Art

Generally speaking, in conventional image sensors, the pixel circuit of each pixel may include multiple transistors and capacitances, so the pixel circuit of each pixel occupies a fixed circuit layout area in the active area (AA). However, with the increasing demand for higher resolution of image sensors and the need for miniaturization of image sensors, it is important in this field to achieve a design that is able to reduce the circuit layout area, the number of circuit components, and the number of signal routings in the pixel circuit.

SUMMARY

This disclosure provides an image sensor and an image sensing method, which may achieve good image sensing functions.

The image sensor of the present disclosure includes a first pixel circuit. The first pixel circuit includes a first driving transistor, a first selection transistor, a first transfer transistor, a first reset transistor, and a first sensing unit. The first terminal of the first driving transistor is coupled to a first operating voltage. The control terminal of the first driving transistor is coupled to a first floating diffusion node. The first terminal of the first selection transistor is coupled to the second terminal of the first driving transistor. The second terminal of the first selection transistor is coupled to the first output terminal. The control terminal of the first selection transistor receives the first selection signal. The first terminal of the first transfer transistor is coupled to the first floating diffusion node. The control terminal of the first transfer transistor receives the first transmitting signal. The first terminal of the first reset transistor is coupled to the first operating voltage. The second terminal of the first reset transistor is coupled to the first floating diffusion node. The first sensing unit is coupled to the second terminal of the first transfer transistor. The control terminal of the first reset transistor receives the first reset signal during the reset period. The control terminal of the first reset transistor receives the first ramp signal during the sensing period.

The image sensing method of the present disclosure is adaptable for image sensors. The image sensor includes a first driving transistor, a first selection transistor, a first transfer transistor, a first reset transistor, and a first sensing unit. The control terminal of the first selection transistor is configured to receive the first selection signal, and the control terminal of the first transfer transistor is configured to receive the first transmitting signal. The image sensing method includes the following steps: receiving the first reset signal during the reset period through the control terminal of the first reset transistor; and receiving the first ramp signal during the sensing period through the control terminal of the first reset transistor.

Based on the above, the image sensor and image sensing method of the present disclosure are able to reset the pixel circuit through the reset transistor during the reset period and perform analog-digital conversion (ADC Conversion) on sensing signal by receiving different signals in the sensing period.

In order to make the above-mentioned features and advantages of this disclosure more comprehensible, the following embodiments are provided, along with the accompanying drawings for a detailed explanation as follows.

DESCRIPTION OF THE EMBODIMENTS

Figure 1:
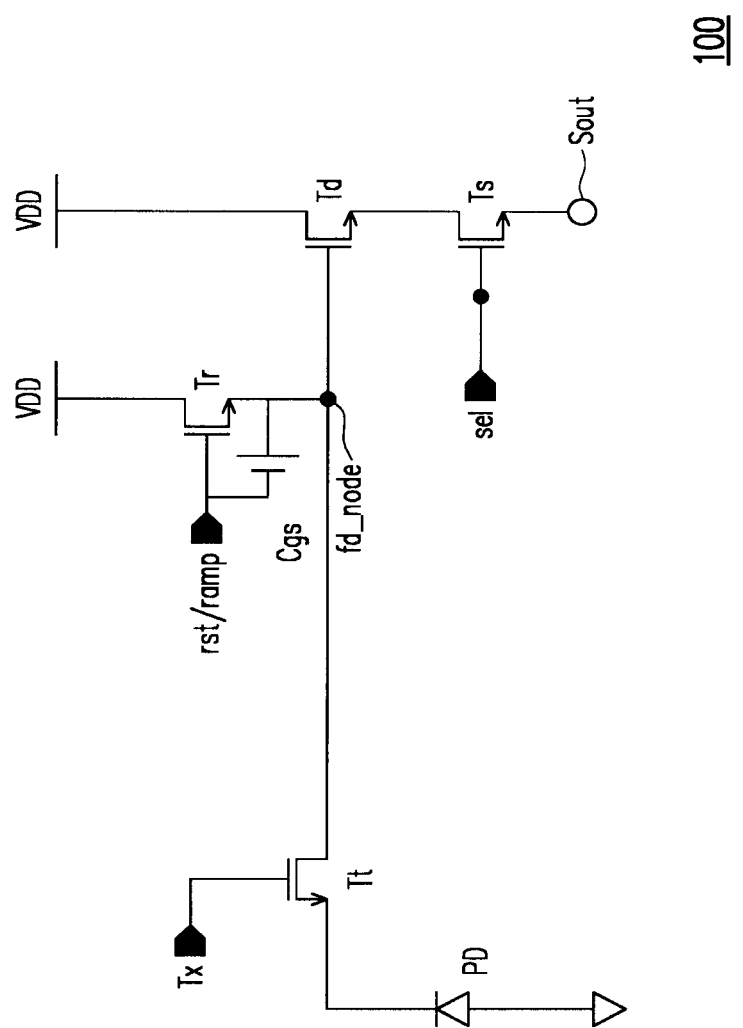
FIG. 1 is a schematic diagram of a pixel circuit in an embodiment of the present disclosure.

In order to make the content of the present disclosure more comprehensible, the following specific examples are used as examples in which the present disclosure can indeed be implemented. In addition, wherever possible, elements/components/steps adopting the same reference numerals in the drawings and embodiments represent the same or similar parts.

FIG. 1 is a schematic diagram of a pixel circuit in an embodiment of the present disclosure. Referring to FIG. 1, a pixel array may be set in the active area of the image sensor of the present disclosure, and each pixel in the pixel array may correspond to the pixel circuit 100 as shown in FIG. 1. The pixel circuit 100 includes a driving transistor Td, a selection transistor Ts, a transfer transistor Tt, a reset transistor Tr, and a sensing unit PD. The first terminal of the driving transistor Td is coupled to the operating voltage VDD. The control terminal of the driving transistor Td is coupled to the floating diffusion node fd_node. The second terminal of the driving transistor Td is coupled to the first terminal of the selection transistor Ts. The first terminal of the selection transistor Ts is coupled to the second terminal of the driving transistor Td. The second terminal of the selection transistor Ts is coupled to the output terminal Sout.

The control terminal of the selection transistor Ts receives the selection signal sel. The first terminal of the transfer transistor Tt is coupled to the floating diffusion node fd_node. The second terminal of the transfer transistor Tt is coupled to the sensing unit PD. The control terminal of the transfer transistor Tt receives the transfer signal Tx. The first terminal of the reset transistor Tr is coupled to the operating voltage VDD. The second terminal of the reset transistor Tr is coupled to the floating diffusion node fd_node. The sensing unit PD is coupled to the second terminal of the transfer transistor Tt.

In this embodiment, the control terminal of the reset transistor Tr receives the reset signal rst during the reset period, and the control terminal of the reset transistor Tr receives the ramp signal ramp during the sensing period. In this embodiment, there is a capacitance Cgs between the control terminal of the reset transistor Tr and the second terminal of the reset transistor Tr. In an embodiment, the capacitance Cgs may be the parasitic capacitance of the reset transistor Tr. In another embodiment, the capacitance Cgs may be the gate-source capacitance (i.e., the parasitic capacitance generated between the gate and source of the transistor). In an embodiment, the parasitic capacitance may also be present between two metal conductive lines. In more detail, a parasitic capacitance may be present between one terminal of the metal conductive line used to transmit the reset signal rst and the floating diffusion node fd_node, and the capacitance value of this parasitic capacitance may be adjusted according to the requirement of the present disclosure. In this embodiment, the driving transistor Td, the selection transistor Ts, the transfer transistor Tt, and the reset transistor Tr may be N-type transistors, but the present disclosure is not limited thereto. In this embodiment, the sensing unit PD may be a photodiode.

Figure 2A:
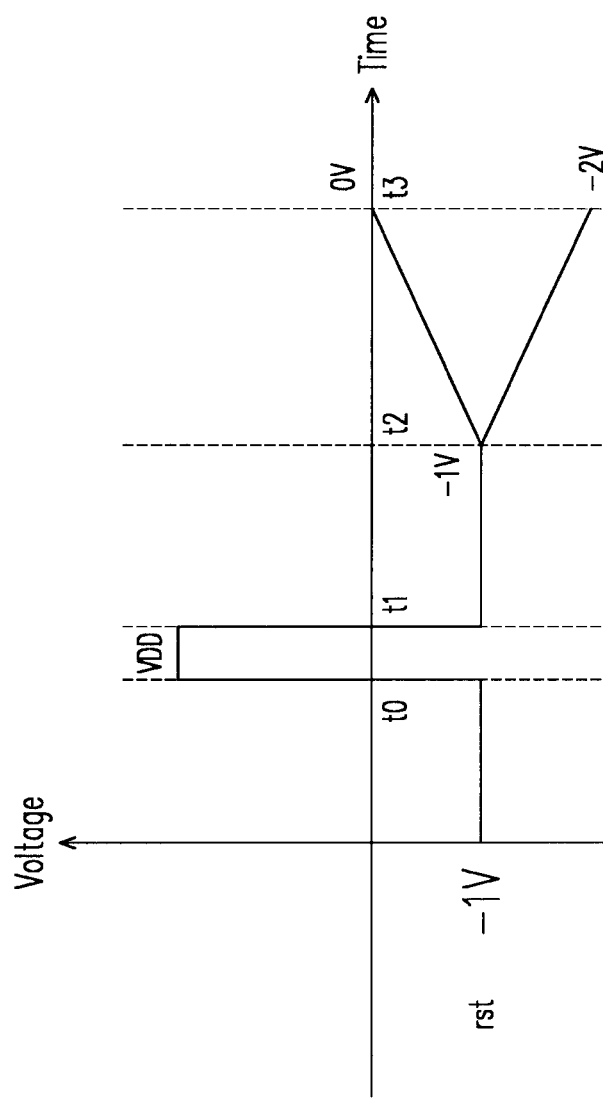
FIG. 2A is a schematic diagram showing the waveform changes of the reset signal and the ramp signal in an embodiment of the present disclosure.
Figure 2B:
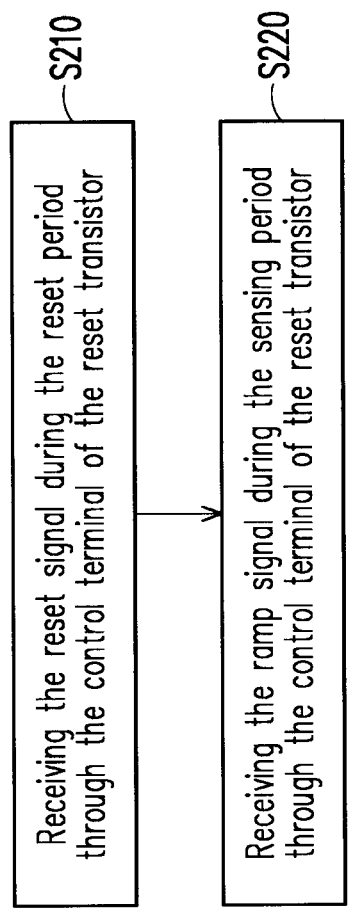
FIG. 2B is a flowchart of an image sensing method in an embodiment of the present disclosure.

FIG. 2A is a schematic diagram showing the waveform changes of the reset signal and the ramp signal in an embodiment of the present disclosure. FIG. 2B is a flowchart of an image sensing method in an embodiment of the present disclosure. Referring to FIG. 1, FIG. 2A, and FIG. 2B, the pixel circuit 100 may operate the image sensing method in the following steps S210~S220. In this embodiment, during the period from time t0 to time t1, the pixel circuit 100 may operate during the reset period to reset the voltage of the floating diffusion node fd_node. During the period from time t2 to time t3, the pixel circuit 100, in conjunction with the backend comparator or amplifier circuit (not shown in the figure), may perform analog-to-digital conversion (ADC Conversion) operation to read out the digital value of the sensing voltage of the floating diffusion node fd_node, and the sensing voltage is supplied by the sensing unit PD (i.e., the sensing voltage output after the exposure operation performed by the sensing unit PD).

In step S210, during the period from time t0 to time t1, the control terminal of the reset transistor Tr may receive a reset signal rst. The reset signal rst may be a pulse signal, and the minimum voltage level of the reset signal rst is a negative voltage (e.g., −1 volt (V)), and the maximum voltage level of the reset signal rst is a positive voltage (e.g., equal to the operating voltage VDD). In step S220, during the period from time t2 to time t3, the control terminal of the transistor Tr may receive a ramp signal ramp. The ramp signal ramp may be a ramp up signal or a ramp down signal. If the ramp signal ramp is a ramp up signal, the voltage level change of the ramp signal ramp may be between zero voltage and a first negative voltage (e.g., −1 volt), and the voltage level of the ramp signal ramp may change from the first negative voltage to zero voltage. If the ramp signal ramp is a ramp down signal, the voltage level change of the ramp signal ramp may be between the first negative voltage and a second negative voltage (e.g., −2 volts), and the voltage level of the ramp signal ramp may change from the first negative voltage to the second negative voltage. In an embodiment, the ramp up signal and the ramp down signal are inverted phases.

In this embodiment, during the period from time t1 to time t3, the selection transistor Ts and the transfer transistor Tt may be turned on according to the selection signal sel and the transmitting signal Tx, respectively (the reset transistor Tr is turned off), so that the sensing result (voltage) of the sensing unit PD may be transmitted to the floating diffusion node fd_node. Moreover, the capacitance Cg may receive the ramp signal ramp, coupling the ramp signal ramp to the floating diffusion node fd_node, so that during the process of coupling the ramp signal ramp to the floating diffusion node fd_node, the driving transistor Td may operate as a source follower to read out the sensing result of the floating diffusion node fd_node to the output terminal Sout through the selection transistor Ts. With the backend comparator or amplifier circuit (not shown in the figure), ADC conversion operation may be performed to read out the digital value of the sensing voltage of the floating diffusion node fd_node.

In this way, the pixel circuit 100 in this embodiment may receive different voltage signals through a single reset transistor Tr during different operation periods, thereby enabling the pixel circuit 100 to perform reset and ADC conversion operations separately. In this way, the pixel circuit 100 does not require additional ramp capacitances and ramp signal routing, thus effectively saving circuit layout space and circuit manufacturing costs.

Figure 3:
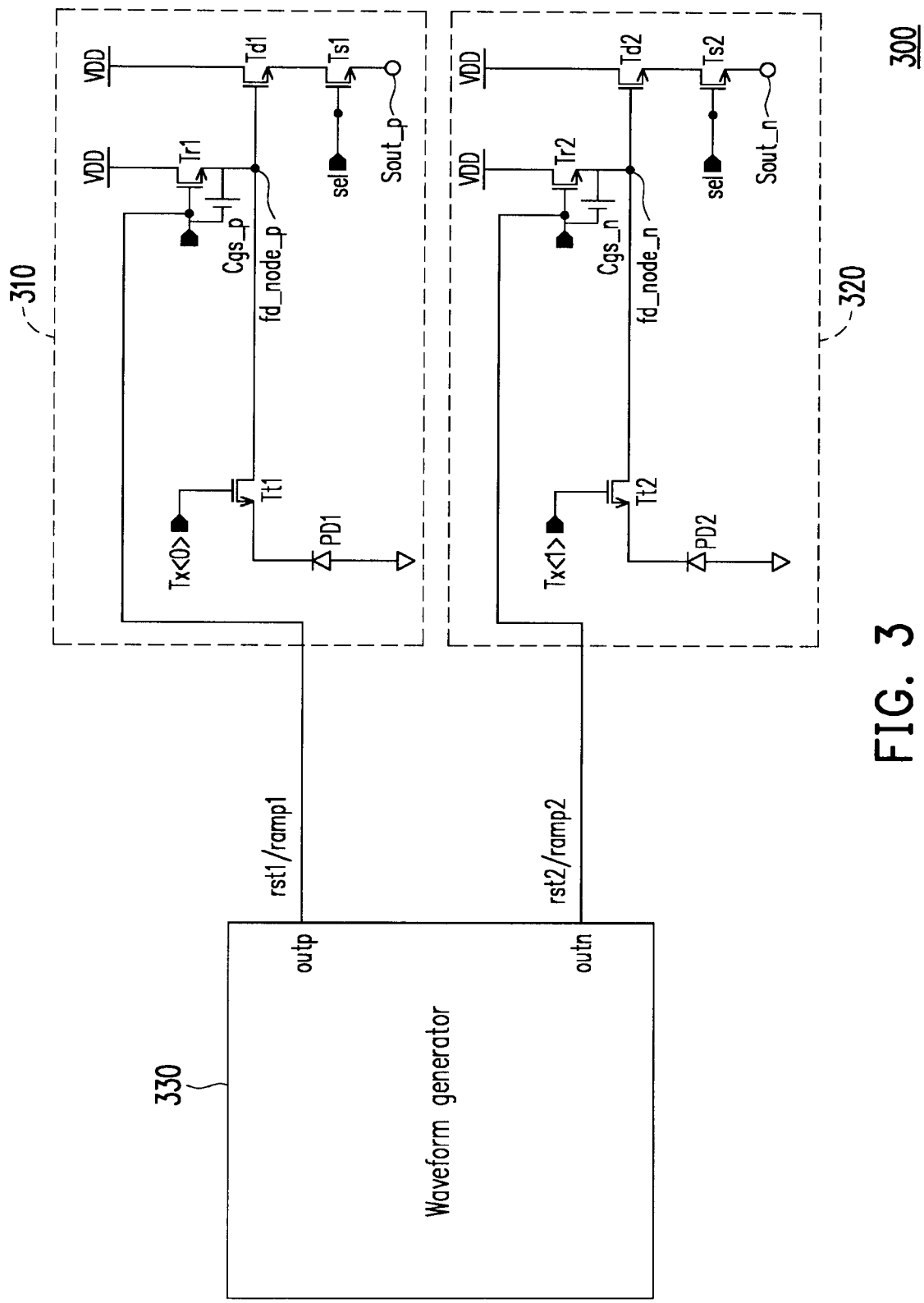
FIG. 3 is a schematic diagram of an image sensor in an embodiment of the present disclosure.

FIG. 3 is a schematic diagram of an image sensor in an embodiment of the present disclosure. Referring to FIG. 3, a pixel array may be set in the active area of the image sensor 300, and every two adjacent pixels in the pixel array may correspond to the first pixel circuit 310 and the second pixel circuit 320 as shown in FIG. 3. The image sensor 300 includes the first pixel circuit 310, the second pixel circuit 320, and the waveform generator 330 (also called waveform generating circuit or signal generating circuit). The first pixel circuit 310 and the second pixel circuit 320 are coupled to the waveform generator 330. The first pixel circuit 310 and the second pixel circuit 320 form a differential output. In an embodiment, the first output terminal Sout_p of the first pixel circuit 310 and the second output terminal Sout_n of the second pixel circuit 320 may be coupled to the first input terminal and the second input terminal of the differential amplifier of the readout circuit.

In this embodiment, the first pixel circuit 310 includes a first driving transistor Td1, a first selection transistor Ts1, a first transfer transistor Tt1, a first reset transistor Tr1, and a first sensing unit PD1. The control terminal of the first driving transistor Td1 is coupled to the first floating diffusion node fd_node_p. The second terminal of the first driving transistor Td1 is coupled to the first terminal of the first selection transistor Ts1. The first terminal of the first selection transistor Ts1 is coupled to the second terminal of the first driving transistor Td1. The second terminal of the first selection transistor Ts1 is coupled to the first output terminal Sout_p. The control terminal of the first selection transistor Ts1 receives the selection signal sel. The first terminal of the first transfer transistor Tt1 is coupled to the floating diffusion node fd_node_p. The second terminal of the first transfer transistor Tt1 is coupled to the first sensing unit PD1. The control terminal of the first transfer transistor Tt1 receives the first transmitting signal Tx<0>. The first terminal of the first reset transistor Tr1 is coupled to the operating voltage VDD. The second terminal of the first reset transistor Tr is coupled to the first floating diffusion node fd_node_p. The first sensing unit PD1 is coupled to the second terminal of the first transfer transistor Tt1.

In this embodiment, the second pixel circuit 320 includes a second driving transistor Td2, a second selection transistor Ts2, a second transfer transistor Tt2, a second reset transistor Tr2, and a second sensing unit PD2. The control terminal of the second driving transistor Td2 is coupled to the second floating diffusion node fd_node_n. The second terminal of the second driving transistor Td2 is coupled to the first terminal of the second selection transistor Ts2. The first terminal of the second selection transistor Ts2 is coupled to the second terminal of the second driving transistor Td2. The second terminal of the second selection transistor Ts2 is coupled to the second output terminal Sout_n. The control terminal of the second selection transistor Ts2 receives the selection signal sel. The first terminal of the second transfer transistor Tt2 is coupled to the floating diffusion node fd_node_n. The second terminal of the second transfer transistor Tt2 is coupled to the first terminal of the second selection transistor Ts2. The control terminal of the second transfer transistor Tt2 receives the second transmitting signal Tx<1>. The first terminal of the second reset transistor Tr2 is coupled to the operating voltage VDD. The second terminal of the second reset transistor Tr is coupled to the second floating diffusion node fd_node_n. The second sensing unit PD2 is coupled to the second terminal of the second transfer transistor Tt2.

In this embodiment, the waveform generator 330 is coupled to the control terminals of the first reset transistor Tr1 and the second reset transistor Tr2. During the reset period, the waveform generator 330 separately provides the first reset signal rst1 and the second reset signal rst2 to the control terminals of the first reset transistor Tr1 and the second reset transistor Tr2. During the sensing period, the waveform generator 330 provides the first ramp signal ramp1 and the second ramp signal ramp2 to the control terminals of the first reset transistor Tr1 and the second reset transistor Tr2.

In this embodiment, the control terminal of the first reset transistor Tr1 receives the first reset signal rst1 during the reset period, and the control terminal of the first reset transistor Tr receives the first ramp signal ramp1 during the sensing period. In this embodiment, there is a capacitance Cgs_p between the control terminal of the first reset transistor Tr1 and the second terminal of the first reset transistor Tr1. In an embodiment, the capacitance Cgs_p may be the parasitic capacitance of the first reset transistor Tr1. In another embodiment, the capacitance Cgs_p may be the gate-source capacitance (i.e., the parasitic capacitance generated between the gate and source of the transistor). In this embodiment, the first driving transistor Td1, the first selection transistor Ts1, the first transfer transistor Tt1, and the first reset transistor Tr1 may be N-type transistors, but the disclosure is not limited thereto. In this embodiment, the first sensing unit PD1 may be a photodiode.

In this embodiment, the control terminal of the second reset transistor Tr2 receives the second reset signal rst2 during the reset period, and the control terminal of the second reset transistor Tr2 receives the second ramp signal ramp2 during the sensing period. In this embodiment, there is a capacitance Cgs_n between the control terminal of the second reset transistor Tr2 and the second terminal of the second reset transistor Tr2. In an embodiment, the capacitance Cgs_n may be the parasitic capacitance of the second reset transistor Tr2. In another embodiment, the capacitance Cgs_n may be the gate-source capacitance (i.e., the parasitic capacitance generated between the gate and source of the transistor). In this embodiment, the second driving transistor Td2, the second selection transistor Ts2, the second transfer transistor Tt2, and the second reset transistor Tr2 may be N-type transistors, but the disclosure is not limited thereto. In this embodiment, the second sensing unit PD2 may be a photodiode.

In this embodiment, the waveform generator 330 may separately provide the first output signal outp and the second output signal outn to the control terminals of the first reset transistor Tr1 and the second reset transistor Tr2, respectively. In this embodiment, the first output terminal Sout_p may be coupled to the first input terminal of the differential amplifier, and the second output terminal Sout_n may be coupled to the second input terminal of the differential amplifier. In this way, the output terminal of the differential amplifier may generate a differential output result based on the voltages of the first output terminal Sout_p and the second output terminal Sout_n.

Figure 4:
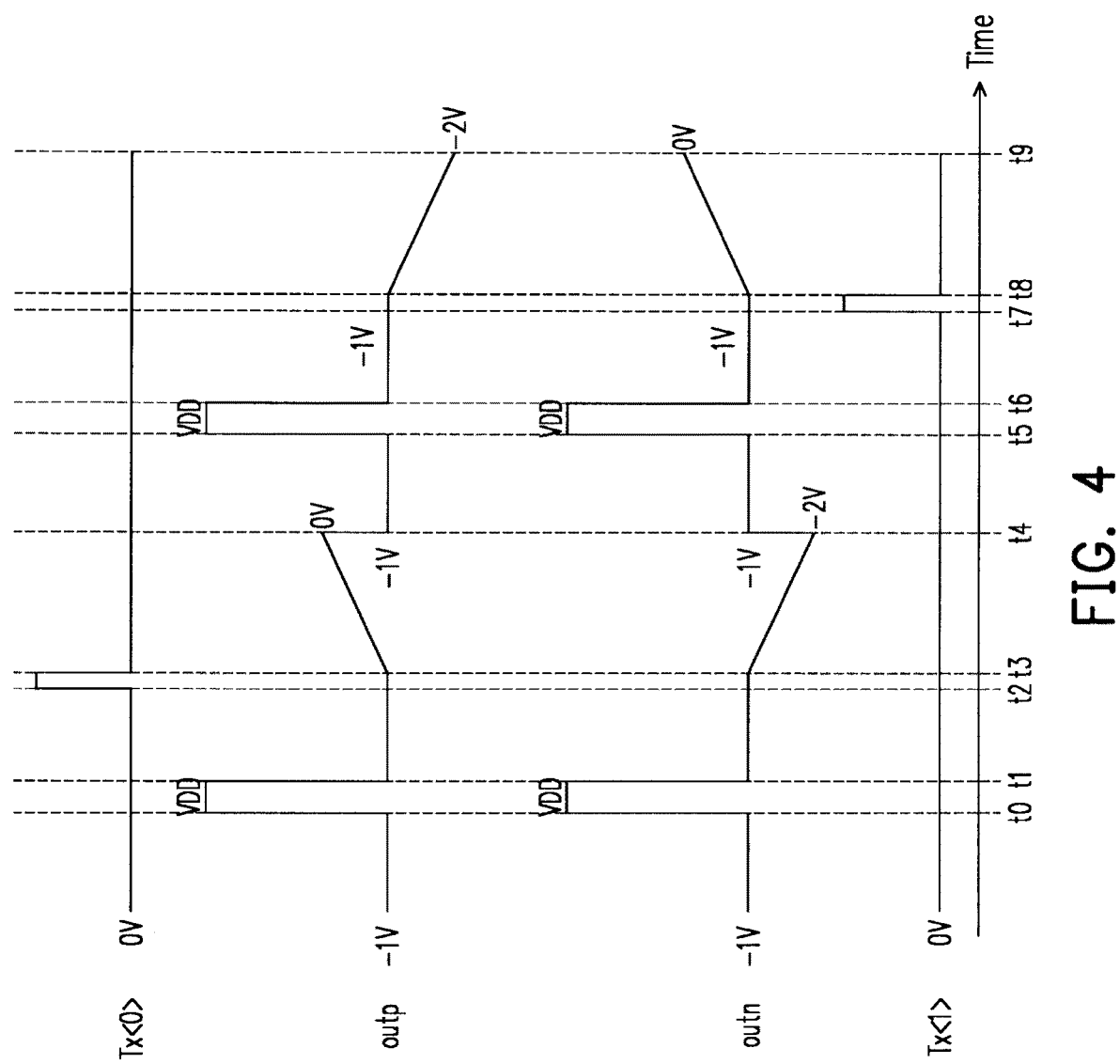
FIG. 4 is a schematic diagram showing the waveform changes of multiple signals in the embodiment of FIG. 3 of the present disclosure.

FIG. 4 is a schematic diagram showing the waveform changes of multiple signals in the embodiment of FIG. 3 of the present disclosure. Referring to FIG. 3 and FIG. 4, in this embodiment, during the period from time t0 to time t1, the image sensor 300 may operate in the first reset period to reset the voltages of the first floating diffusion node fd_node_p and the second floating diffusion node fd_node_n. During the period from time t2 to time t3, the image sensor 300 may operate in the first readout period to read out the sensing voltages and background signals of the first floating diffusion node fd_node_p and the second floating diffusion node fd_node_n, respectively. In this embodiment, during the period from time t5 to time t6, the image sensor 300 may operate in the second reset period to reset the voltages of the first floating diffusion node fd_node_p and the second floating diffusion node fd_node_n. During the period from time t7 to time t8, the image sensor 300 may operate in the second readout period to read out the sensing voltages and background signals of the first floating diffusion node fd_node_p and the second floating diffusion node fd_node_n, respectively.

Before time t0, the first output signal outp and the second output signal outn are both negative voltages (for example, −1 volt (V)) to make the first reset transistor Tr1 and the second reset transistor Tr2 turn off. During the period from time t0 to time t1, the control terminal of the first reset transistor Tr1 may receive the first output signal outp having operating voltage VDD as the first reset signal rst1, and make the first reset transistor Tr1 turn on. The control terminal of the second reset transistor Tr2 may receive the second output signal outn having operating voltage VDD as the second reset signal rst2, and make the second reset transistor Tr2 turn on. In this manner, the first floating diffusion node fd_node_p and the second floating diffusion node fd_node_n may be reset by the operating voltage VDD.

During the period from time t2 to time t3, the first output signal outp and the second output signal outn are both negative voltages (for example, −1 volt (V)) to make the first reset transistor Tr1 and the second reset transistor Tr2 turn off. Moreover, the first transmitting signal Tx<0> may be at a high voltage level to turn on the first transfer transistor Tt1, so as to transmit the sensing result (exposure result) of the first sensing unit PD1 to the first floating diffusion node fd_node_p.

During the period from time t3 to time t4, the control terminal of the first reset transistor Tr1 may receive a first output signal outp having a voltage change in a ramp up waveform to serve as the first ramp signal ramp1, and keep the first reset transistor Tr1 turned off. The voltage level change of the first ramp signal ramp1 may range between zero voltage and a first negative voltage (for example, −1 volt). The control terminal of the second reset transistor Tr2 may receive a second output signal outn having a voltage change in a ramp down waveform to serve as the second ramp signal ramp2, and keep the second reset transistor Tr2 turned off. The voltage level change of the second ramp signal ramp2 may range between the first negative voltage and a second negative voltage (for example, −2 volts). The ramp up signal and the ramp down signal are inverted phases.

In this embodiment, during the period from time t2 to time t4, the first selection transistor Ts1 and the first transfer transistor Tt1 may be turned on according to the selection signal sel and the first transmitting signal Tx<0>, respectively, so that the sensing result (voltage) of the first sensing unit PD1 may be transmitted to the first floating diffusion node fd_node_p. Moreover, the capacitance Cgs_p may receive the first ramp signal ramp1 and couple the first ramp signal ramp1 to the first floating diffusion node fd_node_p, so that during the process of coupling the first ramp signal ramp1 to the first floating diffusion node fd_node_p, the first driving transistor Td1 may operate as a source follower, reading out the sensing result of the first floating diffusion node fd_node_p to the first output terminal Sout_p through the first selection transistor Ts1. In the meantime, the second selection transistor Ts2 may be turned on according to the selection signal sel, and the second transfer transistor Tt2 may be turned off according to the second transmitting signal Tx<1>, so that the second floating diffusion node fd_node_n only has a background signal (or noise signal, such as noise generated on the circuit path). Moreover, the capacitance Cgs_n may receive the second ramp signal ramp2 and couple the second ramp signal ramp2 to the second floating diffusion node fd_node_n, so that during the process of coupling the second ramp signal ramp2 to the second floating diffusion node fd_node_n, the second driving transistor Td2 may operate as a source follower to read out the background signal of the second floating diffusion node fd_node_n to the second output terminal Sout_n through the second selection transistor Ts2. In this way, the backend differential amplifier may output the denoised first sensing signal and perform ADC conversion.

Between time t4 and time t5, the first output signal outp and the second output signal outn are both negative voltages (for example, −1 volt (V)), making the first reset transistor Tr1 and the second reset transistor Tr2 to be turned off. During the period from time t5 to time t6, the control terminal of the first reset transistor Tr1 may receive the first output signal outp having operating voltage VDD as the first reset signal rst1, and make the first reset transistor Tr1 turn on. The control terminal of the second reset transistor Tr2 may receive the second output signal outn having operating voltage VDD as the second reset signal rst2, and make the second reset transistor Tr2 turn on. In this way, the first floating diffusion node fd_node_p and the second floating diffusion node fd_node_n may be reset by the operating voltage VDD.

During the period from time t7 to time t8, the first output signal outp and the second output signal outn are both negative voltages (for example, −1 volt (V)) to make the first reset transistor Tr1 and the second reset transistor Tr2 turn off. Moreover, the second transmitting signal Tx<1> may be at a high voltage level to turn on the second transfer transistor Tt2, so as to transmit the sensing result (exposure result) of the second sensing unit PD2 to the second floating diffusion node fd_node_n.

During the period from time t8 to time t9, the control terminal of the first reset transistor Tr1 may receive the first output signal outp having a voltage change in a ramp down waveform to serve as the first ramp signal ramp1, and keep the first reset transistor Tr1 turned off. The voltage level change of the first ramp signal ramp1 may be between the first negative voltage and the second negative voltage (for example, −2 volts). The control terminal of the second reset transistor Tr2 may receive the second output signal outn having a voltage change in ramp up waveform to serve as the second ramp signal ramp2, and keep the second reset transistor Tr2 turned off. The voltage level change of the second ramp signal ramp2 may be between zero voltage and the first negative voltage (for example, −1 volt). The ramp up signal and the ramp down signal are inverted phases.

In this embodiment, during the period from time t7 to time t9, the first selection transistor Ts1 may be turned on according to the selection signal sel, and the first transfer transistor Tt1 may be turned off according to the first transmitting signal Tx<0>, so that the first floating diffusion node fd_node_p has only the background signal (also known as noise signal). Moreover, the capacitance Cgs_p may receive the first ramp signal ramp1 and couple the first ramp signal ramp1 to the first floating diffusion node fd_node_p, so that during the process of coupling the first ramp signal ramp1 to the first floating diffusion node fd_node_p, the first driving transistor Td1 may operate as a source follower to read out the background signal of the first floating diffusion node fd_node_p to the first output terminal Sout_p through the first selection transistor Ts1. Meanwhile, the second selection transistor Ts2 and the second transfer transistor Tt2 may be turned on according to the selection signal sel and the second transmitting signal Tx<1>, respectively, so that the sensing result (voltage) of the second sensing unit PD2 may be transmitted to the second floating diffusion node fd_node_n. Moreover, the capacitance Cgs_n may receive the second ramp signal ramp2 to couple the second ramp signal ramp2 to the second floating diffusion node fd_node_n, so that during the process of coupling the second ramp signal ramp2 to the second floating diffusion node fd_node_n, the second driving transistor Td2 may operate as a source follower to read out the sensing result of the second floating diffusion node fd_node_n to the second output terminal Sout_n through the second selection transistor Ts2. In this way, the backend differential amplifier of this embodiment may output the denoised second sensing signal and perform ADC conversion.

In this way, the pixel circuits 310 and 320 of the image sensor 300 in this embodiment may receive different voltage signals during different operation periods through a single reset transistor, thereby enabling the pixel circuits 310 and 320 to perform reset and ADC conversion operations, respectively. In this way, the pixel circuits 310 and 320 do not need to be respectively provided with additional ramp capacitances and ramp signal routing, thus effectively saving circuit layout space and manufacturing costs. Moreover, the image sensor 300 of this embodiment may automatically generate a denoised sensing signal through differential output.

Figure 5:
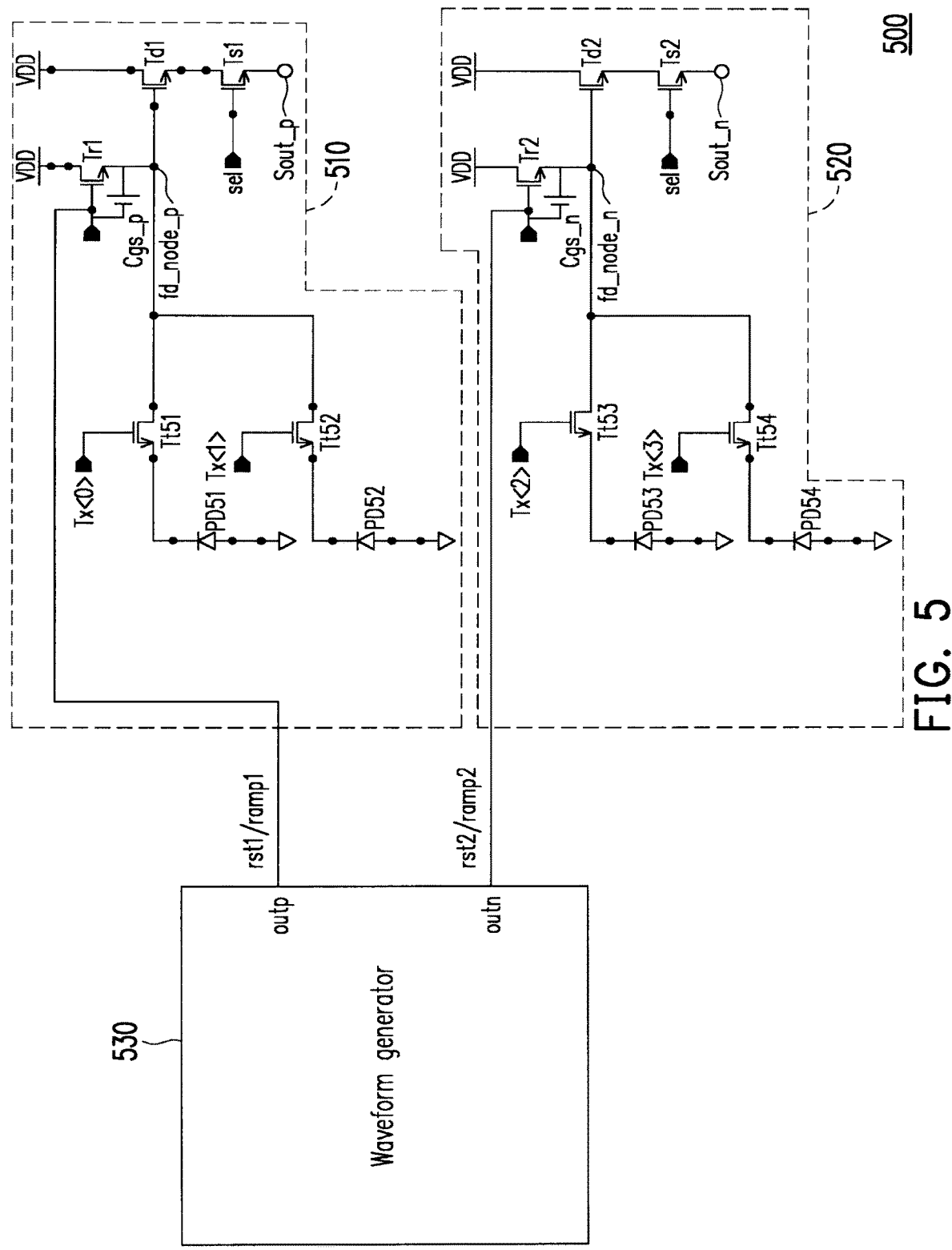
FIG. 5 is a schematic diagram of an image sensor in another embodiment of the present disclosure.

FIG. 5 is a schematic diagram of an image sensor in another embodiment of the present disclosure. Referring to FIG. 5, a pixel array may be set in the active area of the image sensor 500, and two pairs of adjacent pixels (a total of four pixels) in the pixel array may respectively correspond to the first pixel circuit 510 and the second pixel circuit 520 as shown in FIG. 5. The image sensor 500 includes the first pixel circuit 510, the second pixel circuit 520, and the waveform generator 530. The first pixel circuit 510 and the second pixel circuit 520 are coupled to the waveform generator 530. The first pixel circuit 510 and the second pixel circuit 520 form a differential output. In an embodiment, the first output terminal Sout_p of the first pixel circuit 510 and the second output terminal Sout_n of the second pixel circuit 520 may be coupled to the first input terminal and the second input terminal of the differential amplifier of the readout circuit.

In this embodiment, the first pixel circuit 510 includes a first driving transistor Td1, a first selection transistor Ts1, a first transfer transistor Tt51, a first reset transistor Tr1, a first sensing unit PD51, a second transfer transistor Tt52 (i.e., another first transfer transistor described in claims), and a second sensing unit PD52 (i.e., another first sensing unit described in claims). The control terminal of the first driving transistor Td1 is coupled to the first floating diffusion node fd_node_p. The second terminal of the first driving transistor Td1 is coupled to the first terminal of the first selection transistor Ts1. The first terminal of the first selection transistor Ts1 is coupled to the second terminal of the first driving transistor Td1. The second terminal of the first selection transistor Ts1 is coupled to the first output terminal Sout_p. The control terminal of the first selection transistor Ts1 receives the selection signal sel. The first terminal of the first transfer transistor Tt51 is coupled to the first floating diffusion node fd_node_p. The second terminal of the first transfer transistor Tt51 is coupled to the first sensing unit PD51. The control terminal of the first transfer transistor Tt51 receives the first transmitting signal Tx<0>. The first terminal of the first reset transistor Tr1 is coupled to the operating voltage VDD. The second terminal of the first reset transistor Tr is coupled to the first floating diffusion node fd_node_p. The first sensing unit PD51 is coupled to the second terminal of the first transfer transistor Tt51. The first terminal of the second transfer transistor Tt52 is coupled to the first floating diffusion node fd_node_p. The second terminal of the second transfer transistor Tt52 is coupled to the second sensing unit PD52. The control terminal of the second transfer transistor Tt52 receives the second transmitting signal Tx<1>. The second sensing unit PD52 is coupled to the second terminal of the second transfer transistor Tt52.

In this embodiment, the second pixel circuit 520 includes a second driving transistor Td2, a second selection transistor Ts2, a third transfer transistor Tt53 (i.e., the second transfer transistor described in claims), a second reset transistor Tr2, a third sensing unit PD53 (i.e., the second sensing unit described in claims), a fourth transfer transistor Tt54 (i.e., another second transfer transistor described in claims), and a fourth sensing unit PD54 (i.e., another second sensing unit described in claims). The control terminal of the second driving transistor Td2 is coupled to the second floating diffusion node fd_node_n. The second terminal of the second driving transistor Td2 is coupled to the first terminal of the second selection transistor Ts2. The first terminal of the second selection transistor Ts2 is coupled to the second terminal of the second driving transistor Td2. The second terminal of the second selection transistor Ts2 is coupled to the second output terminal Sout_n. The control terminal of the second selection transistor Ts2 receives the selection signal sel. The first terminal of the third transfer transistor Tt53 is coupled to the floating diffusion node fd_node_n. The second terminal of the third transfer transistor Tt53 is coupled to the first terminal of the second selection transistor Ts2. The control terminal of the third transfer transistor Tt53 receives the second transmitting signal Tx<2>. The first terminal of the second reset transistor Tr2 is coupled to the operating voltage VDD. The second terminal of the second reset transistor Tr is coupled to the second floating diffusion node fd_node_n. The third sensing unit PD53 is coupled to the second terminal of the third transfer transistor Tt53. The first terminal of the fourth transfer transistor Tt54 is coupled to the second floating diffusion node fd_node_n. The second terminal of the fourth transfer transistor Tt54 is coupled to the fourth sensing unit PD54. The control terminal of the fourth transfer transistor Tt54 receives the fourth transmitting signal Tx<3>. The third sensing unit PD53 is coupled to the second terminal of the fourth transfer transistor Tt54.

In this embodiment, the waveform generator 530 is coupled to the control terminals of the first reset transistor Tr1 and the second reset transistor Tr2. During the reset period, the waveform generator 530 provides the first reset signal rst1 and the second reset signal rst2 respectively to the control terminals of the first reset transistor Tr1 and the second reset transistor Tr2. During the sensing period, the waveform generator 530 provides the first ramp signal ramp1 and the second ramp signal ramp2 to the control terminals of the first reset transistor Tr1 and the second reset transistor Tr2.

In this embodiment, the control terminal of the first reset transistor Tr1 receives the first reset signal rst1 during the reset period, and the control terminal of the first reset transistor Tr receives the first ramp signal ramp1 during the sensing period. In this embodiment, there is a capacitance Cgs_p between the control terminal of the first reset transistor Tr1 and the second terminal of the first reset transistor Tr1. In an embodiment, the capacitance Cgs_p may be the parasitic capacitance of the first reset transistor Tr1. In another embodiment, the capacitance Cgs_p may be the gate-source capacitance (i.e., the parasitic capacitance generated between the gate and source of the transistor). In this embodiment, the first driving transistor Td1, the first selection transistor Ts1, the first transfer transistor Tt51, the second transfer transistor Tt52, and the first reset transistor Tr1 may be N-type transistors, but the disclosure is not limited thereto. In this embodiment, the first sensing unit PD51 and the second sensing unit PD52 may be photodiodes.

In this embodiment, the control terminal of the second reset transistor Tr2 receives the second reset signal rst2 during the reset period, and the control terminal of the second reset transistor Tr2 receives the second ramp signal ramp2 during the sensing period. In this embodiment, there is a capacitance Cgs_n between the control terminal of the second reset transistor Tr2 and the second terminal of the second reset transistor Tr2. In an embodiment, the capacitance Cgs_n may be the parasitic capacitance of the second reset transistor Tr2. In another embodiment, the capacitance Cgs_n may be the gate-source capacitance (i.e., the parasitic capacitance generated between the gate and source of the transistor). In this embodiment, the second driving transistor Td2, the second selection transistor Ts2, the third transfer transistor Tt53, the fourth transfer transistor Tt54, and the second reset transistor Tr2 may be N-type transistors, but the disclosure is not limited thereto. In this embodiment, the third sensing unit PD53 and the fourth sensing unit PD54 may be photodiodes.

In this embodiment, the waveform generator 530 may provide the first output signal outp and the second output signal outn to the control terminals of the first reset transistor Tr1 and the second reset transistor Tr2, respectively. In this embodiment, the first output terminal Sout_p may be coupled to the first input terminal of the differential amplifier, and the second output terminal Sout_n may be coupled to the second input terminal of the differential amplifier. In this way, the output terminal of the differential amplifier may generate a differential output result based on the voltages of the first output terminal Sout_p and the second output terminal Sout_n.

Figure 6:
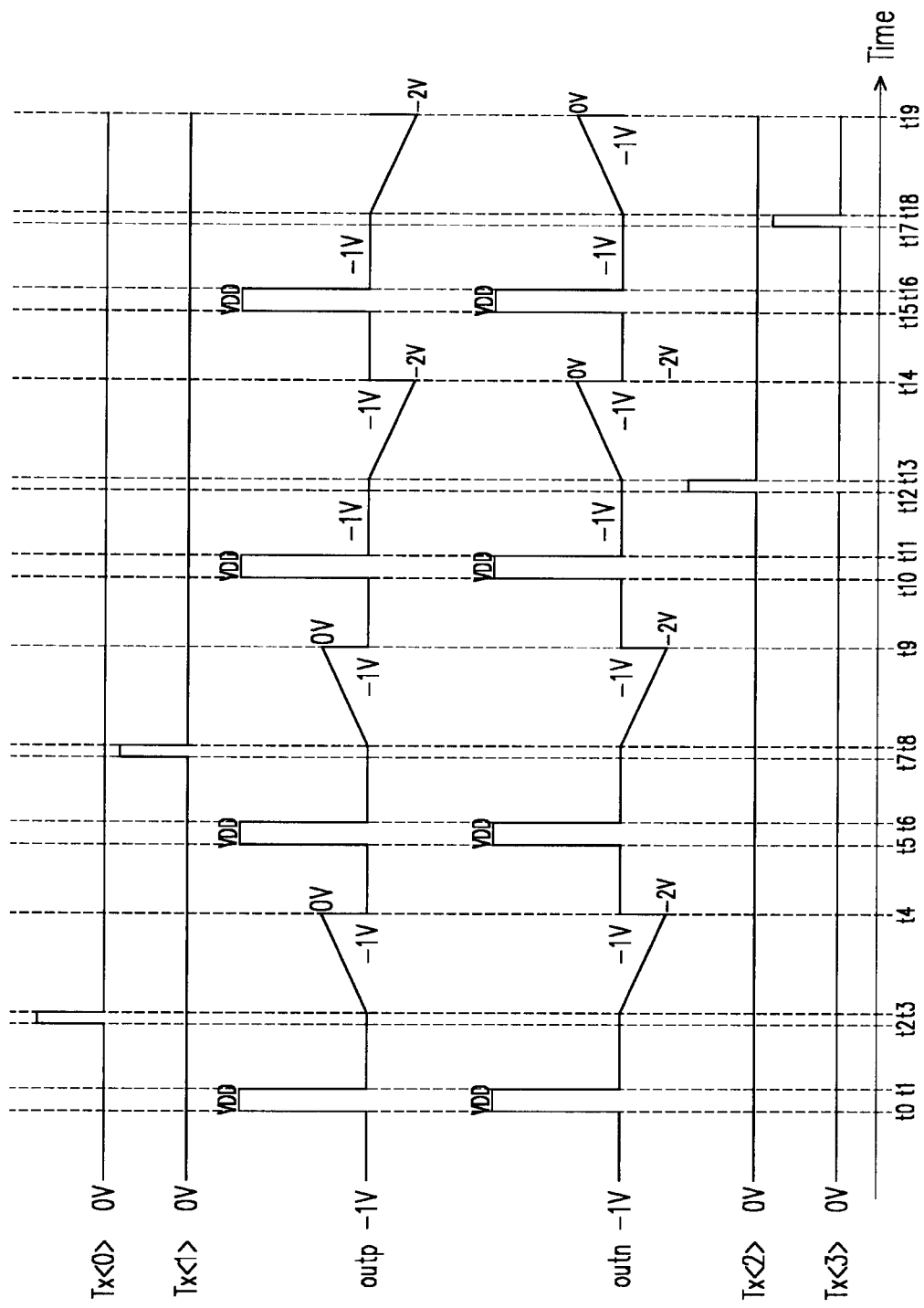
FIG. 6 is a schematic diagram showing the waveform changes of multiple signals in the embodiment of FIG. 5 of the present disclosure.

FIG. 6 is a schematic diagram showing the waveform changes of multiple signals in the embodiment of FIG. 5 of the present disclosure. Referring to FIG. 5 and FIG. 6, in this embodiment, during the period from time t0 to time t1, the image sensor 500 may operate in the first reset period to reset the voltages of the first floating diffusion node fd_node_p and the second floating diffusion node fd_node_n. During the period from time t2 to time t3, the image sensor 300 may operate in the first readout period to read out the sensing voltages and background signals of the first floating diffusion node fd_node_p and the second floating diffusion node fd_node_n, respectively. In this embodiment, during the period from time t5 to time t6, the image sensor 300 may operate in the second reset period to reset the voltages of the first floating diffusion node fd_node_p and the second floating diffusion node fd_node_n. During the period from time t7 to time t8, the image sensor 500 may operate in the second readout period to read out the sensing voltages and background signals of the first floating diffusion node fd_node_p and the second floating diffusion node fd_node_n, respectively.

During the period from time t10 to time t11, the image sensor 500 may operate in the third reset period to reset the voltage of the first floating diffusion node fd_node_p and the second floating diffusion node fd_node_n. During the period from time t12 to time t13, the image sensor 500 may operate in the third readout period to separately read out the sensing voltages and background signals of the first floating diffusion node fd_node_p and the second floating diffusion node fd_node_n. In this embodiment, during the period from time t15 to time t16, the image sensor 300 may operate in the fourth reset period to reset the voltages of the first floating diffusion node fd_node_p and the second floating diffusion node fd_node_n. During the period from time t17 to time t18, the image sensor 500 may operate in the fourth readout period to separately read out the sensing voltages and background signals of the first floating diffusion node fd_node_p and the second floating diffusion node fd_node_n.

Before time t0, the first output signal outp and the second output signal outn are both negative voltages (for example, −1 volt (V)) to make the first reset transistor Tr1 and the second reset transistor Tr2 turn off. During the period from time t0 to time t1, the control terminal of the first reset transistor Tr1 may receive the first output signal outp with operating voltage VDD as the first reset signal rst1, and make the first reset transistor Tr1 turn on. The control terminal of the second reset transistor Tr2 may receive the second output signal outn with operating voltage VDD as the second reset signal rst2, and make the second reset transistor Tr2 turn on. In this way, the first floating diffusion node fd_node_p and the second floating diffusion node fd_node_n may be reset by the operating voltage VDD.

During the period from time t2 to time t3, the first output signal outp and the second output signal outn are both negative voltages (for example, −1 volt (V)) to make the first reset transistor Tr1 and the second reset transistor Tr2 turn off. Moreover, the first transmitting signal Tx<0> may be at a high voltage level to turn on the first transfer transistor Tt51, so as to transmit the sensing result (exposure result) of the first sensing unit PD51 to the first floating diffusion node fd_node_p.

During the period from time t3 to time t4, the control terminal of the first reset transistor Tr1 may receive the first output signal outp having a voltage change in a ramp up waveform as the first ramp signal ramp1, and keep the first reset transistor Tr1 turned off. The voltage level change of the first ramp signal ramp1 may be between zero voltage and the first negative voltage (for example, −1 volt). The control terminal of the second reset transistor Tr2 may receive the second output signal outn having a voltage change in a ramp down waveform to serve as the second ramp signal ramp2, and keep the second reset transistor Tr2 turned off. The voltage level change of the second ramp signal ramp2 may be between the first negative voltage and the second negative voltage (for example, −2 volts). The ramp up signal and the ramp down signal are inverted phases.

In this embodiment, during the period from time t2 to time t4, the first selection transistor Ts1 and the first transfer transistor Tt1 may be turned on according to the selection signal sel and the first transmitting signal Tx<0>, respectively, so that the sensing result (voltage) of the first sensing unit PD51 may be transmitted to the first floating diffusion node fd_node_p. Moreover, the capacitance Cgs_p may receive the first ramp signal ramp1 and couple the first ramp signal ramp1 to the first floating diffusion node fd_node_p, so that during the process of coupling the first ramp signal ramp1 to the first floating diffusion node fd_node_p, the first driving transistor Td1 may operate as a source follower to read out the sensing result of the first floating diffusion node fd_node_p to the first output terminal Sout_p through the first selection transistor Ts1. In the meantime, the second selection transistor Ts2 may be turned on according to the selection signal sel, and the second transfer transistor Tt52, the third transfer transistor Tt53, and the fourth transfer transistor Tt54 may be turned off according to the second transmitting signal Tx<1>, the third transmitting signal Tx<2>, and the fourth transmitting signal Tx<3>, respectively, so that the second floating diffusion node fd_node_n only has a background signal (or noise signal). Moreover, the capacitance Cgs_n may receive the second ramp signal ramp2 to couple the second ramp signal ramp2 to the second floating diffusion node fd_node_n, so that during the process of coupling the second ramp signal ramp2 to the second floating diffusion node fd_node_n, the second driving transistor Td2 may operate as a source follower to read out the background signal of the second floating diffusion node fd_node_n to the second output terminal Sout_n through the second selection transistor Ts2. In this way, the backend differential amplifier may output the denoised first sensing signal and perform ADC conversion.

Between time t4 and time t5, the first output signal outp and the second output signal outn are both negative voltages (for example, −1 volt (V)), making the first reset transistor Tr1 and the second reset transistor Tr2 to be turned off. During the period from time t5 to time t6, the control terminal of the first reset transistor Tr1 may receive the first output signal outp having the operating voltage VDD as the first reset signal rst1, and make the first reset transistor Tr1 turn on. The control terminal of the second reset transistor Tr2 may receive the second output signal outn having the operating voltage VDD as the second reset signal rst2, and make the second reset transistor Tr2 turn on. In this way, the first floating diffusion node fd_node_p and the second floating diffusion node fd_node_n may be reset by the operating voltage VDD.

During the period from time t7 to time t8, the first output signal outp and the second output signal outn are both negative voltages (for example, −1 volt (V)) to make the first reset transistor Tr1 and the second reset transistor Tr2 turn off. Moreover, the second transmitting signal Tx<1> may be at a high voltage level to turn on the second transfer transistor Tt52, so as to transmit the sensing result (exposure result) of the second sensing unit PD52 to the first floating diffusion node fd_node_p.

During the period from time t8 to time t9, the control terminal of the first reset transistor Tr1 may receive the first output signal outp having a voltage change in a ramp up waveform to serve as the first ramp signal ramp1, and keep the first reset transistor Tr1 turned off. The voltage level change of the first ramp signal ramp1 may range between zero voltage and the first negative voltage (for example, −1 volt). The control terminal of the second reset transistor Tr2 may receive the second output signal outn having a voltage change in a ramp down waveform to serve as the second ramp signal ramp2, and keep the second reset transistor Tr2 turned off. The voltage level change of the second ramp signal ramp2 may range between the first negative voltage and the second negative voltage (for example, −2 volts). The ramp up signal and the ramp down signal are inverted phases.

In this embodiment, during the period from time t7 to time t9, the first selection transistor Ts1 and the second transfer transistor Tt52 may be turned on according to the selection signal sel and the second transmitting signal Tx<1>, respectively, so that the sensing result (voltage) of the second sensing unit PD52 may be transmitted to the first floating diffusion node fd_node_p. Moreover, the capacitance Cgs_p may receive the first ramp signal ramp1 to couple the first ramp signal ramp1 to the first floating diffusion node fd_node_p, so that during the process of coupling the first ramp signal ramp1 to the first floating diffusion node fd_node_p, the first driving transistor Td1 may operate as a source follower to read out the sensing result of the first floating diffusion node fd_node_p to the first output terminal Sout_p through the first selection transistor Ts1. In the meantime, the second selection transistor Ts2 may be turned on according to the selection signal sel, and the first transfer transistor Tt51, the second transfer transistor Tt3, and the fourth transfer transistor Tt54 may be turned off according to the first transmitting signal Tx<0>, the third transmitting signal Tx<2>, and the fourth transmitting signal Tx<3>, respectively, so that the second floating diffusion node fd_node_n only has a background signal (or noise signal). Moreover, the capacitance Cgs_n may receive the second ramp signal ramp2 to couple the second ramp signal ramp2 to the second floating diffusion node fd_node_n, so that during the process of coupling the second ramp signal ramp2 to the second floating diffusion node fd_node_n, the second driving transistor Td2 may operate as a source follower to read out the background signal of the second floating diffusion node fd_node_n to the second output terminal Sout_n through the second selection transistor Ts2. Therefore, the backend differential amplifier may output the denoised second sensing signal and perform ADC conversion.

Between time t9 and time t10, the first output signal outp and the second output signal outn are both negative voltages (for example, −1 volt (V)) to make the first reset transistor Tr1 and the second reset transistor Tr2 turn off. During the period from time t10 to time t11, the control terminal of the first reset transistor Tr1 may receive the first output signal outp having the operating voltage VDD as the first reset signal rst1, and make the first reset transistor Tr1 turn on. The control terminal of the second reset transistor Tr2 may receive the second output signal outn having the operating voltage VDD as the second reset signal rst2, and make the second reset transistor Tr2 turn on. In this manner, the first floating diffusion node fd_node_p and the second floating diffusion node fd_node_n may be reset by the operating voltage VDD.

During the period from time t12 to time t13, the first output signal outp and the second output signal outn are both negative voltages (for example, −1 volt (V)) to make the first reset transistor Tr1 and the second reset transistor Tr2 turn off. Moreover, the third transmitting signal Tx<2> may be at a high voltage level to turn on the second transfer transistor Tt3, so as to transmit the sensing result (exposure result) of the third sensing unit PD53 to the second floating diffusion node fd_node_n.

During the period from time t13 to time t14, the control terminal of the first reset transistor Tr1 may receive the first output signal outp having a voltage change in a ramp down waveform to serve as the first ramp signal ramp1, and keep the first reset transistor Tr1 turned off. The voltage level change of the first ramp signal ramp1 may be between the first negative voltage and the second negative voltage (for example, −2 volts). The control terminal of the second reset transistor Tr2 may receive the second output signal outn having a voltage change in a ramp up waveform to serve as the second ramp signal ramp2, and keep the second reset transistor Tr2 turned off. The voltage level change of the second ramp signal ramp2 may be between zero voltage and the first negative voltage (for example, −1 volt). The ramp up signal and the ramp down signal are inverted phases.

In this embodiment, during the period from time t12 to time t14, the first selection transistor Ts1 may be turned on according to the selection signal sel, and the first transfer transistor Tt51 and the second transfer transistor Tt52 may be turned off according to the first transmitting signal Tx<0> and the second transmitting signal Tx<1>, so that the first floating diffusion node fd_node_p has only a background signal (also called noise signal). Moreover, the capacitance Cgs_p may receive the first ramp signal ramp1 to couple the first ramp signal ramp1 to the first floating diffusion node fd_node_p, so that during the process of coupling the first ramp signal ramp1 to the first floating diffusion node fd_node_p, the first driving transistor Td1 may operate as a source follower to read out the background signal of the first floating diffusion node fd_node_p to the first output terminal Sout_p through the first selection transistor Ts1. In the meantime, the second selection transistor Ts2 and the third transfer transistor Tt3 may be turned on according to the selection signal sel and the third transmitting signal Tx<2>, respectively, so that the sensing result (voltage) of the third sensing unit PD53 may be transmitted to the second floating diffusion node fd_node_n. Moreover, the capacitance Cgs_n may receive the second ramp signal ramp2 to couple the second ramp signal ramp2 to the second floating diffusion node fd_node_n, so that during the process of coupling the second ramp signal ramp2 to the second floating diffusion node fd_node_n, the second driving transistor Td2 may operate as a source follower to read out the sensing result of the second floating diffusion node fd_node_n to the second output terminal Sout_n through the second selection transistor Ts2. In this way, the backend differential amplifier of this embodiment may output the denoised third sensing signal and perform ADC conversion.

Between time t14 and time t15, the first output signal outp and the second output signal outn are both negative voltages (for example, −1 volt (V)) to make the first reset transistor Tr1 and the second reset transistor Tr2 to be turned off. During the period from time t15 to time t16, the control terminal of the first reset transistor Tr1 may receive the first output signal outp having the operating voltage VDD as the first reset signal rst1, and make the first reset transistor Tr1 turn on. The control terminal of the second reset transistor Tr2 may receive the second output signal outn having the operating voltage VDD as the second reset signal rst2, and make the second reset transistor Tr2 turn on. In this way, the first floating diffusion node fd_node_p and the second floating diffusion node fd_node_n may be reset by the operating voltage VDD.

During the period from time t17 to time t18, the first output signal outp and the second output signal outn are both negative voltages (for example, −1 volt (V)) to make the first reset transistor Tr1 and the second reset transistor Tr2 turn off. Moreover, the fourth transmitting signal Tx<3> may be at a high voltage level to turn on the fourth transfer transistor Tt54, so as to transmit the sensing result (exposure result) of the fourth sensing unit PD54 to the second floating diffusion node fd_node_n.

During the period from time t18 to time t19, the control terminal of the first reset transistor Tr1 may receive the first output signal outp having a voltage change in a ramp down waveform to serve as the first ramp signal ramp1, and keep the first reset transistor Tr1 turned off. The voltage level change of the first ramp signal ramp1 may be between the first negative voltage and the second negative voltage (for example, −2 volts). The control terminal of the second reset transistor Tr2 may receive the second output signal outn having a voltage change in a ramp up waveform to serve as the second ramp signal ramp2, and keep the second reset transistor Tr2 turned off. The voltage level change of the second ramp signal ramp2 may be between zero voltage and the first negative voltage (for example, −1 volt). The ramp up signal and the ramp down signal are inverted phases.

In this embodiment, during the period from time t17 to time t19, the first selection transistor Ts1 may be turned on according to the selection signal sel, and the first transfer transistor Tt51 and the second transfer transistor Tt52 may be turned off according to the first transmitting signal Tx<0> and the second transmitting signal Tx<1>, so that the first floating diffusion node fd_node_p has only a background signal (also called noise signal). Moreover, the capacitance Cgs_p may receive the first ramp signal ramp1 to couple the first ramp signal ramp1 to the first floating diffusion node fd_node_p, so that during the process of coupling the first ramp signal ramp1 to the first floating diffusion node fd_node_p, the first driving transistor Td1 may operate as a source follower to read out the background signal of the first floating diffusion node fd_node_p to the first output terminal Sout_p through the first selection transistor Ts1. In the meantime, the second selection transistor Ts2 and the third transfer transistor Tt53 may be turned on according to the selection signal sel and the fourth transmitting signal Tx<3>, respectively, so that the sensing result (voltage) of the fourth sensing unit PD54 may be transmitted to the second floating diffusion node fd_node_n. Moreover, the capacitance Cgs_n may receive the second ramp signal ramp2 to couple the second ramp signal ramp2 to the second floating diffusion node fd_node_n, so that during the process of coupling the second ramp signal ramp2 to the second floating diffusion node fd_node_n, the second driving transistor Td2 may operate as a source follower to read out the sensing result of the second floating diffusion node fd_node_n to the second output terminal Sout_n through the second selection transistor Ts2. Therefore, the backend differential amplifier of this embodiment may output the denoised fourth sensing signal and perform ADC conversion.

In this way, the pixel circuits 510 and 520 of the image sensor 500 in this embodiment may receive different voltage signals during different operation periods through a single reset transistor, thereby enabling the pixel circuits 510 and 520 to perform reset and ADC conversion operations, respectively. In this manner, the pixel circuits 510 and 520 do not need to be respectively provided with additional ramp capacitances and ramp signal routing, thus effectively saving circuit layout space and manufacturing costs of circuits. Moreover, the image sensor 500 of this embodiment may automatically generate a denoised sensing signal through differential output. Furthermore, the pixel circuit 510 of this embodiment may be designed to allow two photosensitive units to share a floating diffusion node. In this manner, the pixel circuit area of the image sensor 500 in this embodiment may also be reduced, thereby realizing a miniaturized sensor.

In summary, the image sensor and image sensing method of the present disclosure may receive a reset signal through the reset transistor of the pixel circuit to achieve the reset operation of the pixel circuit, and may receive a ramp signal through the parasitic capacitance of the reset transistor of the pixel circuit to achieve the ADC conversion operation of the sensing result of the pixel circuit. The reset signal and the ramp signal may be provided by the same signal line. In this way, the image sensor of the present disclosure does not need to be provided with a ramp capacitance in the active area, thereby saving the number of signal routings and effectively saving the circuit layout space and manufacturing cost of circuits. Moreover, the image sensor and image sensing method of the present disclosure may also achieve the output of sensing results without background noise.

Although the present disclosure has been disclosed in the embodiments as described above, it is not intended to limit the disclosure. Anyone with general knowledge in the relevant technical field can make minor modifications and refinements without departing from the spirit and scope of the present disclosure. Therefore, the scope to be protected by the present disclosure should be defined by the appended claims of the patent disclosure.

What is claimed is:
1. An image sensor, comprising:
a first pixel circuit, comprising:
a first driving transistor, wherein a first terminal of the first driving transistor is coupled to a first operating voltage, and a control terminal of the first driving transistor is coupled to a first floating diffusion node;
a first selection transistor, wherein a first terminal of the first selection transistor is coupled to a second terminal of the first driving transistor, a second terminal of the first selection transistor is coupled to a first output terminal, and a control terminal of the first selection transistor receives a first selection signal;
a first transfer transistor, wherein a first terminal of the first transfer transistor is coupled to the first floating diffusion node, and a control terminal of the first transfer transistor receives a first transmitting signal;
a first reset transistor, wherein a first terminal of the first reset transistor is coupled to the first operating voltage, a second terminal of the first reset transistor is coupled to the first floating diffusion node; and
a first sensing unit, coupled to a second terminal of the first transfer transistor, wherein a control terminal of the first reset transistor receives a first reset signal during a reset period, and the control terminal of the first reset transistor receives a first ramp signal during a sensing period.

2. The image sensor according to claim 1, wherein there is a capacitance between the control terminal of the first reset transistor and the second terminal of the first reset transistor.

3. The image sensor according to claim 2, wherein the capacitance is a parasitic capacitance of the first reset transistor.

4. The image sensor according to claim 3, wherein the capacitance is a gate-source capacitance.

5. The image sensor according to claim 1, wherein a parasitic capacitance is present between one terminal of a metal conductive line configured to transmit the first reset signal and the first floating diffusion node, and the parasitic capacitance serves as the capacitance.

6. The image sensor according to claim 1, wherein a lowest voltage level of the first reset signal is a negative voltage, and a highest voltage level of the first reset signal is a positive voltage.

7. The image sensor according to claim 1, wherein a voltage level of the first ramp signal varies between a zero voltage and a negative voltage.

8. The image sensor according to claim 1, further comprising:
a waveform generator, coupled to the control terminal of the first reset transistor,
wherein the waveform generator provides the first reset signal to the control terminal of the first reset transistor during the reset period, and the waveform generator provides the first ramp signal to the control terminal of the first reset transistor during the sensing period.

9. The image sensor according to claim 1, wherein the first pixel circuit further comprises:
a third transfer transistor, wherein a first terminal of the third transfer transistor is coupled to the first floating diffusion node; and
a third sensing unit, coupled to a second terminal of the third transfer transistor.

10. The image sensor according to claim 1, further comprising:
a second pixel circuit, comprising:
a second driving transistor, wherein a first terminal of the second driving transistor is coupled to the first operating voltage, and a control terminal of the second driving transistor is coupled to a second floating diffusion node;
a second selection transistor, wherein a first terminal of the second selection transistor is coupled to a second terminal of the second driving transistor, a second terminal of the second selection transistor is coupled to a second output terminal, and a control terminal of the second selection transistor receives a second selection signal;
a second transfer transistor, wherein a first terminal of the second transfer transistor is coupled to the second floating diffusion node, and a control terminal of the second transfer transistor receives a second transmitting signal;
a second reset transistor, wherein a first terminal of the second reset transistor is coupled to the first operating voltage, and a second terminal of the second reset transistor is coupled to the second floating diffusion node; and
a second sensing unit, coupled to a second terminal of the second transfer transistor,
wherein a control terminal of the second reset transistor receives a second reset signal during the reset period, and the control terminal of the second reset transistor receives a second ramp signal during the sensing period.

11. The image sensor according to claim 10, wherein the first reset signal is the same as the second reset signal.

12. The image sensor according to claim 10, wherein the first ramp signal and the second ramp signal are inverted phases.

13. The image sensor according to claim 10, wherein the first output terminal is coupled to a first input terminal of a differential amplifier, and the second output terminal is coupled to a second input terminal of the differential amplifier.

14. The image sensor according to claim 10, wherein the first pixel circuit further comprises:
a third transfer transistor, wherein a first terminal of the third transfer transistor is coupled to the first floating diffusion node; and
a third sensing unit, coupled to a second terminal of the third transfer transistor,
wherein the second pixel circuit further comprises:
a fourth transfer transistor, wherein a first terminal of the fourth transfer transistor is coupled to the second floating diffusion node; and
a fourth sensing unit, coupled to a second terminal of the fourth transfer transistor.

15. An image sensing method, which is adaptable for an image sensor, wherein the image sensor comprises a first driving transistor, a first selection transistor, a first transfer transistor, a first reset transistor, and a first sensing unit, wherein a control terminal of the first selection transistor is configured to receive a first selection signal, and a control terminal of the first transfer transistor is configured to receive a first transmitting signal, wherein the image sensing method comprises:
receiving a first reset signal during a reset period through a control terminal of the first reset transistor; and
receiving a first ramp signal during a sensing period through the control terminal of the first reset transistor.

16. The image sensing method according to claim 15, wherein a lowest voltage level of the first reset signal is a negative voltage, and a highest voltage level of the first reset signal is a positive voltage.

17. The image sensing method according to claim 15, wherein a voltage level of the first ramp signal varies between a zero voltage and a negative voltage.

* * * * *